(12) United States Patent
Choi

(10) Patent No.: US 6,731,002 B2
(45) Date of Patent: May 4, 2004

(54) HIGH FREQUENCY POWER DEVICE WITH A PLASTIC MOLDED PACKAGE AND DIRECT BONDED SUBSTRATE

(75) Inventor: Kang Rim Choi, Cupertino, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 09/992,602

(22) Filed: Nov. 13, 2001

(65) Prior Publication Data

US 2002/0163070 A1 Nov. 7, 2002

Related U.S. Application Data

(60) Provisional application No. 60/288,854, filed on May 4, 2001.

(51) Int. Cl.[7] .................. H01L 23/46; H01L 23/52; H01L 29/40
(52) U.S. Cl. .................. 257/735; 257/692
(58) Field of Search .................. 257/664, 69, 482, 257/728, 735, 666; 438/111, 123

(56) References Cited

U.S. PATENT DOCUMENTS

| | | | |
|---|---|---|---|
| 3,651,434 A | * | 3/1972 | McGeough et al. |
| 3,769,560 A | * | 10/1973 | Miyake et al. |
| 3,784,883 A | * | 1/1974 | Duncan et al. |
| 3,908,185 A | * | 9/1975 | Martin |
| 4,278,990 A | | 7/1981 | Fichot |
| 4,483,810 A | | 11/1984 | Bunk et al. |
| 4,563,383 A | | 1/1986 | Kuneman et al. |
| 4,891,686 A | * | 1/1990 | Krausse |
| 4,925,024 A | | 5/1990 | Ellenberger et al. |
| 5,075,759 A | | 12/1991 | Moline |
| 5,164,885 A | | 11/1992 | Drye et al. |
| 5,198,885 A | | 3/1993 | Ibrahim |
| 5,291,065 A | | 3/1994 | Arai et al. |
| 5,338,974 A | | 8/1994 | Wisherd et al. |
| 5,455,448 A | | 10/1995 | Benjamin |
| 5,488,252 A | | 1/1996 | Johansson et al. |

(List continued on next page.)

FOREIGN PATENT DOCUMENTS

DE            19931694 A1     1/2001

OTHER PUBLICATIONS

Burgess et al., "Hybrid Packages by the Direct Bonded Copper Process," *Solid State Technology*, pp. 42–44 (May 1975).
Gioia, J. Charles, "MIC Package Using Thick Film and Direct Bond Copper* for 100–W L–Band Power Amplifier," *Proceedings of 1979 Int. Microelectronics Symposium*, pp. 214–218, held Nov. 13–15, 1975 in Los Angeles, CA.

*Primary Examiner*—Sheila V. Clark
(74) *Attorney, Agent, or Firm*—Townsend and Townsend and Crew LLP

(57) ABSTRACT

A radio frequency power device includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. A semiconductor die is bonded to the first conductive layer of the substrate. A plastic package encloses and protects the semiconductor die. A plurality of leads extend outwardly from the plastic package. The leads have blade-like shapes.

24 Claims, 7 Drawing Sheets

U.S. PATENT DOCUMENTS

| | | |
|---|---|---|
| 5,519,936 A | 5/1996 | Andros et al. |
| 5,561,323 A | 10/1996 | Andros et al. |
| 5,596,231 A | 1/1997 | Combs |
| 5,601,932 A | 2/1997 | Krum et al. |
| 5,637,922 A | 6/1997 | Fillion et al. |
| 5,646,445 A | 7/1997 | Masumoto et al. |
| 5,650,662 A | 7/1997 | Edwards et al. |
| 5,675,181 A | 10/1997 | Nishiura et al. |
| 5,696,466 A | 12/1997 | Li |
| 5,760,473 A | 6/1998 | Dickson et al. |
| 5,767,573 A | 6/1998 | Noda et al. |
| 5,783,466 A | 7/1998 | Takahashi et al. |
| 5,808,357 A * | 9/1998 | Sokoda et al. |
| 5,834,840 A | 11/1998 | Robbins et al. |
| 5,877,555 A | 3/1999 | Leighton et al. |
| 5,889,319 A | 3/1999 | Moller et al. |
| 5,942,797 A | 8/1999 | Terasawa |
| 6,020,636 A | 2/2000 | Adishian |
| 6,056,186 A | 5/2000 | Dickson et al. |
| 6,181,200 B1 | 1/2001 | Titizian et al. |

* cited by examiner

HIGH FREQUENCY POWER DEVICE WITH A PLASTIC MOLDED PACKAGE AND DIRECT BONDED SUBSTRATE

CROSS-REFERENCES TO RELATED APPLICATIONS

This application claims priority to U.S. Provisional Patent Application No. 60/288,854, filed on May 4, 2001, which is incorporated by reference herein for all purposes.

BACKGROUND OF THE INVENTION

This invention relates to electronic devices, and more particularly to a packaged high frequency (or radio frequency (RF)) power semiconductor device with either a direct-bonded metal substrate or a plastic package, or both.

The use of semiconductor transistors for RF applications has increased dramatically over the years as heat dissipation, size, dependability, and other improved characteristics have made such transistors well-suited for many applications. Such semiconductor transistors are used in electrical circuits which operates at 1 MHz or greater, typically at 25 MHz or even 500 MHz or greater. In some of such electrical circuits, the transistors are part of the power conversion circuit and are required to act as the switching element, in frequencies greater than 1 MHz, as in advance switch mode power supplies, resonant converters, DC to DC converters, and the like. For these applications, a lower cost RF type package is preferably used to provide a competitive solution in comparison to the lower frequency prior art applications.

These RF power transistors are typically housed in packages ("RF packages") to form RF power devices. The RF packages provide mechanical support and a means for dissipating heat for integrated circuits. Mechanical support is necessary to facilitate handling and prevent breakage of the integrated circuit during installation or operation of the device. Heat dissipating characteristics of the RF packages are particularly important for RF power devices which have high power outputs. RE devices typically output from 1 to 1,000 Watts during their normal operations.

The packages for such high power transistors must be capable of dissipating the relatively high quantities of heat generated by the transistor to maintain the transistor at a suitable operating temperature, i.e., a temperature which will not adversely affect the operating characteristics of the transistor. Heat decreases the performance and operating life of the transistor. Moreover, heat generated at the collector-base junction can create a temperature buildup which may eventually cause the device to short-circuit. Another important characteristic for such packages is that they provide for good electrical grounding of the transistor with a minimum of parasitic inductance.

A semiconductor die of the RF power device may be mounted on a thermally conductive pad which acts as an internal heatsink (i.e., a component provided as a part of the power device) and dissipates the heat generated by the power device. In order to prevent electrical losses, however, the thermally conductive pad must also be electrically insulating. Hence, a thermally conducting, electrically insulating material is used for the mounting pad. Beryllia (beryllium oxide—BeO) and alumina (aluminum oxide—$Al_2O_3$) are commonly used materials for the mounting pad.

Of the two, beryllia is used more extensively due to its superior thermal conductivity over alumina. However, BeO is highly toxic material, and extreme care must be exercised in handling it. Beryllia can be hazardous to the human respiratory system when in the powder form, as the BeO pad is machined or polished. Proper equipment and safeguards are needed to insure that it is handled safely and that improper contact with humans is avoided. In fact, the United States military has prohibited the use of BeO except under exceptional circumstances. Therefore, among other improvements, it would be desirable to eliminate or reduce usage of Beryllia in fabricating RF power devices.

BRIEF SUMMARY OF THE INVENTION

The invention provides a packaged power semiconductor device having electrical isolation between the potential of a die inside the package and a metal back side of the package. A power semiconductor die is mounted on a direct-bonded copper ("DBC") substrate. The die may be mounted using solder or other die-attach means. A lead of the package is also soldered to the DBC substrate. In some embodiments, all leads are soldered to connecting pads on the DBC substrate.

In one embodiment, a radio frequency power device includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. A semiconductor die is bonded to the first conductive layer of the substrate. A plastic package encloses and protects the semiconductor die. A plurality of leads extend outwardly from the plastic package. The leads have blade-like shapes.

A further understanding of the nature and advantages of the present invention may be realized by reference to the remaining portions of the specification and the drawings.

DESCRIPTION OF THE SPECIFIC EMBODIMENTS

Embodiments of the present invention use direct bonded metal substrates and plastic packages for high frequency or radio frequency (RF) power devices, thereby providing a simplified construction of an RF power device package for mass production, reduced costs, reduced thermal fatigue problem associated with multilayered packages, reduced thermal resistance of the package, reduced thermal fatigue effect, and the like.

As used herein, the term "direct bonded metal substrate" refers to substrate comprising a dielectric layer and a conductive layer bonded to each other by heating them to a temperature between the eutectic and melting temperatures of the conductive layer. The conductive layers may be copper, aluminum, or the like. The dielectric layer may be aluminum nitride, alumina, or other ceramic materials. Examples of the direct bonded metal substrate includes a direct bonded copper (DCB) or direct copper bonded (DBC) substrate, a direct aluminum bonded (DAB) substrate, and the like. Generally, the direct bonded metal substrate has two conductive layers with a dielectric layer provided therebetween. A more detail description of the direct bonded metal substrate will be provided later.

Figure 1:
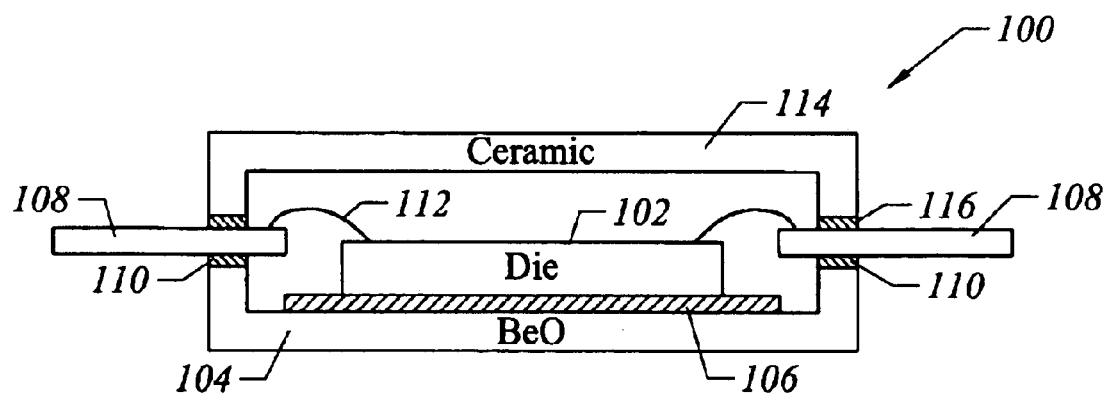
FIG. 1 illustrates a cross sectional view of a conventional RF power device.
Figure 2:
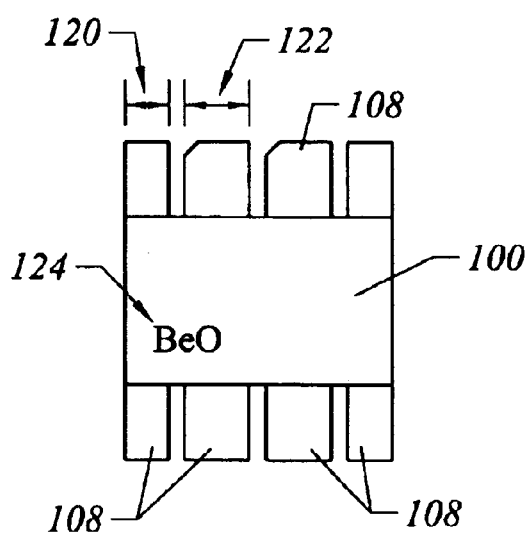
FIG. 2 illustrates a top plan view of an RF power device using a BeO substrate.

FIGS. 1 and 2 illustrate a conventional RF power device 100. The device has a semiconductor die 102 provided over a ceramic mounting substrate or pad 104. Beryllia is used for the mounting pad due to its superior thermal conductivity characteristics. The beryllia pad 104 is metalized to provide a bonding layer 106 in order to bond the die 102 to the mounting pad 104. A plurality of leads 108 are soldered or brazed to the edges of the ceramic pad 104, as indicated by solder 110. A plurality of wires are bonded to portions of the die and the plurality of leads to provide electrical coupling between these two parts of the RF power device. A ceramic cap 114 is placed over the semiconductor die, and the edges of the cap 114 are bonded to the leads 108 with solder 116, thereby providing a hermetic package.

As seen from FIG. 2, the leads 108 are configured to be wide and thin due to the "skin effect" in high frequency current. For example, a width 120 of the lead ranges from about 0.1 to 0.2 inch (2.54–5.08 mm) depending on the size of the RF power device, and a width 122 of the lead ranges from about 0.125 to 0.346 inch (3.18–8.79 mm). The thickness of the leads generally ranges from about 0.003 to 0.02 inch (0.08–0.51 mm), preferably about 0.006 inch (0.15 mm). The leads 108 are configured to have a "tape-like shape" or "blade-like shape" described above to provided increased surface area for the leads. At high frequencies (e.g., over 50 MHz) a substantial amount of the electrical current flows in outer edges (or skin) of the conductor. The magnetic fields generated by the alternating current tend to push the current towards the outside of the conductor. The current squeezes more and more tightly against the surface of the conductor at higher and higher frequencies. As used herein, the term "tape-like shape" or "blade-like shape" describes an object having a width that is significantly greater than its thickness to handle the skin effect.

The devices, such as the RF power device 100, are expensive, costing about $100, due to the use of the beryllia pad 104 and ceramic cap 114. Generally, use of ceramic material increases the cost of the device, particularly if a beryllia substrate is used. Its toxic nature requires extra care in handling and manufacturing the RF power device. For example, many countries including the United States of America require all products containing beryllia be marked as containing BeO, as indicated by a marking 124 (FIG. 2). Industries have continued using beryllia for the mounting pad 104 because of its superior thermal conductivity over aluminum nitride or alumina, particularly for high frequency RF power device with blade-like leads and operating at or above 50 MHz.

In addition, the use of the ceramic cap 114 increases the costs of manufacturing since each RF power device needs to be custom made individually. Therefore, unlike plastic packages, multiple RF power devices cannot be packaged with a plurality of ceramic caps 114 in a single process. Other disadvantages of the conventional power device 100 will become apparent as embodiments of the present invention are described below.

As used herein, the term "high frequency RF device" or "high frequency RF power device" refers to RF power device operating at or above 50 MHz, preferably over 80 MHz. Generally, high frequency RF device is provided with leads having blade-like shapes to handle the "skin effect" described above. Generally, the high frequency RF power device operates at high voltage (e.g., $V_{DS}$ of 500 V or greater) and outputs high power (e.g., 300 Watts or greater).

Figure 3:
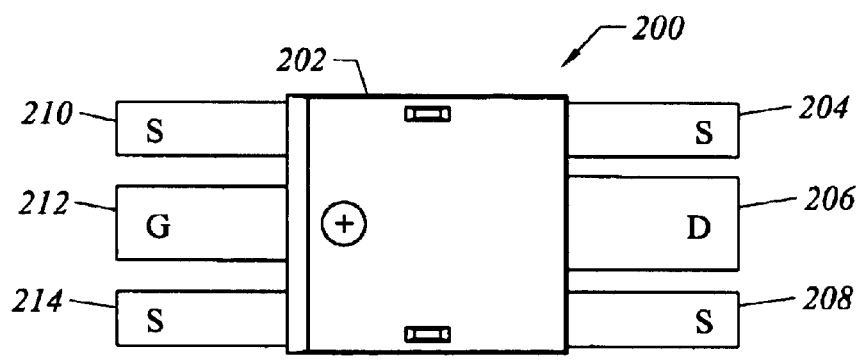
FIG. 3 illustrates a top plan view of a high frequency RF power device according to one embodiment of the present invention.
Figure 4:
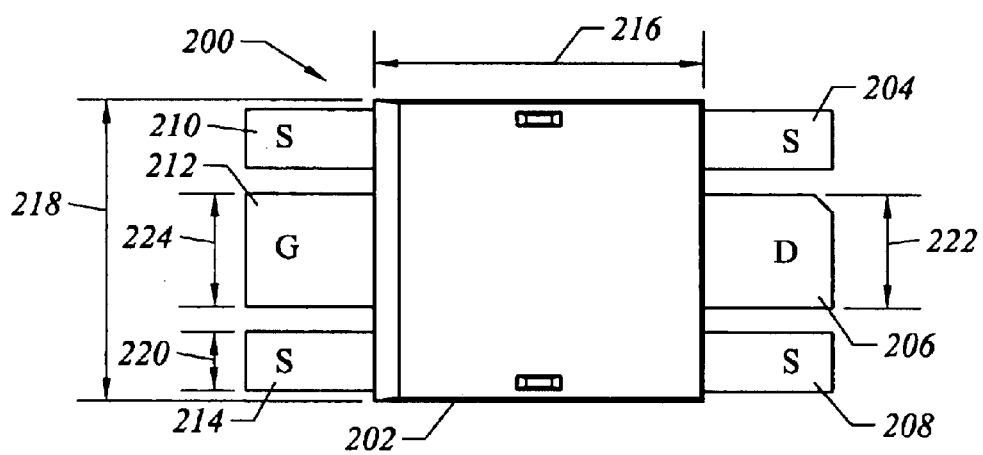
FIG. 4 illustrates a top plan view of a high frequency RF power device with dimensions according to one embodiment of the present invention.
Figure 5:
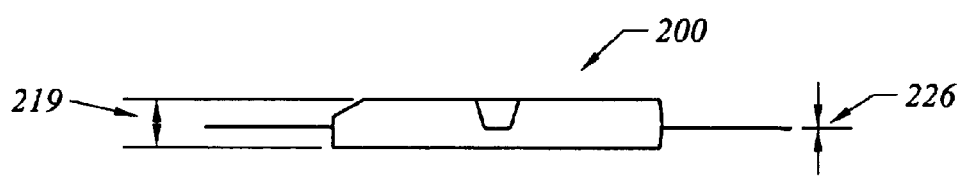
FIG. 5 illustrates a cross sectional view of a high frequency RF power device according to one embodiment of the present invention.

FIGS. 3–5 illustrate a high frequency RF power device 200 having a plastic package 202 and a direct bonded metal substrate (not shown) according to one embodiment of the present invention. The device 200 includes the plastic package 202 and a plurality of leads 204–214 having blade-like shapes with the leads extending outwardly from opposing sides of the package. The device 200 is designed to operate at 400 to 1500 volts ($V_{DS}$), generate current ($I_{DS}$) of 5 to 15 amperes, and output of 250 to 1000 Watts. The device 200 is design to operate at frequencies up to 100 MHz in one implementation, or up to 200 MHz in another implementation, or greater in yet another implementation. In one embodiment, the device 200 is a discrete device having a single semiconductor die enclosed within the package having a main surface area of about 0.2 to 1 square inch (5.08–25.4 mm).

Referring to FIGS. 4 and 5, the dimensions of the device 200 varies according to different embodiments of the present invention. For example, the package 202 has a length 216 ranging from about 0.5 to 1 inch (12.70–25.4 mm) and a width 218 ranging from about 0.5 to 1 inch (12.70–25.4 mm). The package has a thickness 219 ranging from 0.1 to 0.15 inch (2.54–3.81 mm). In the present embodiment, the package 202 has a length 216 of about 0.91 inch (23.11 mm), a width 218 of about 0.83 inch (21.08 mm) and a thickness 219 of about 0.125 inch (3.18 mm).

The device includes three types of leads, all having blade-like shapes in one embodiment of the present invention. The leads of first type, the leads 204, 208, 210, and 214, are coupled to source regions of the semiconductor die (not shown) within the package 202. Each lead has a width 220 ranging from about 0.1 to 0.17 inch (2.54–4.32 mm). The lead of second type, the lead 206, is coupled to a drain region and has a width 222 ranging from about 0.125 to 0.346 inch (3.18–8.79 mm). The lead of third type, the lead 212, is coupled to a gate and has a width 224 ranging from about 0.085 to 0.306 inch (2.16–7.77 mm). These leads 204–214 generally have a thickness 226 ranging from about 0.1 to 0.15 inch (2.54–3.81 mm). In one embodiment, the leads 204, 208, 210, and 214 have the width 220 of about 0.162 inch (4.11 mm). The lead 206 has the width 222 of about 0.346 inch (8.79 mm). The lead 212 has the width 224 of about 0.306 inch (7.77 mm). All of these leads have substantially the same thickness 226 of about 0.006 inch (0.15 mm). Accordingly, in this embodiment, the ratio of width to thickness for the leads 204, 208, 210, and 214 with the smallest width is 27, i.e., the width is 27 times greater than the thickness. In other embodiments, the ratio of width to thickness is greater (e.g., 30, 35, or 40) or smaller (e.g., 20, 15, or 10) than 27.

Figure 6A:
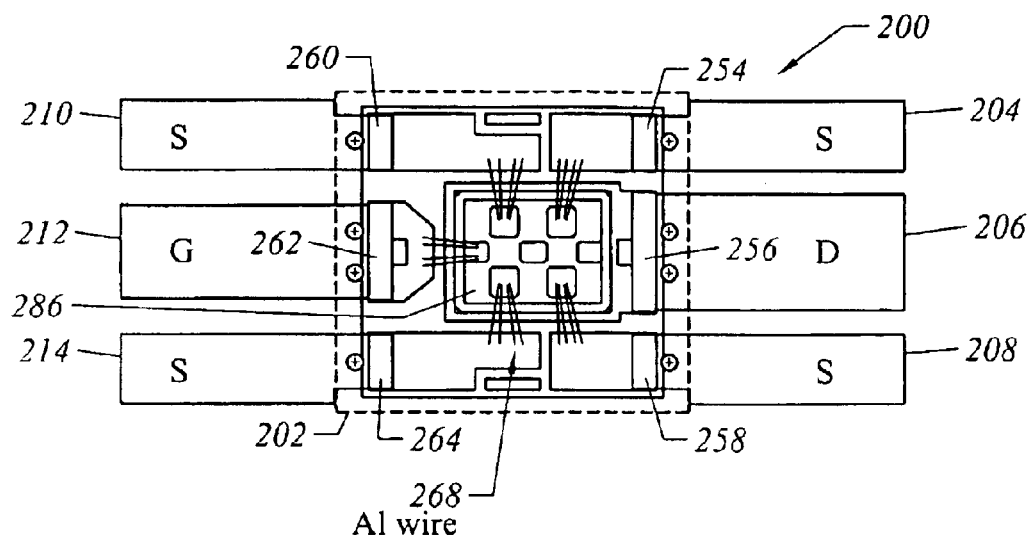
FIG. 6A illustrates a top plan view of a high frequency RF power device with the plastic package delayered according to one embodiment of the present invention.
Figure 6B:
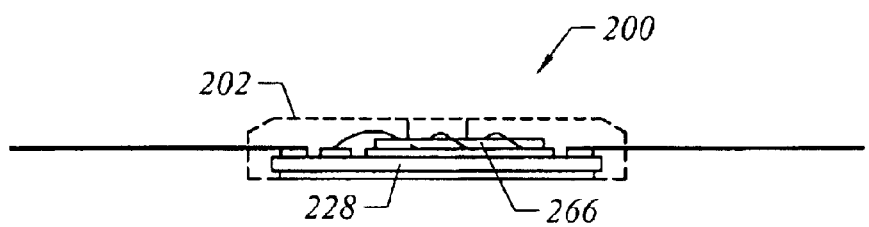
FIG. 6B illustrates a cross sectional view of a high frequency RF power device with the plastic package delayered according to one embodiment of the present invention.
Figure 7:
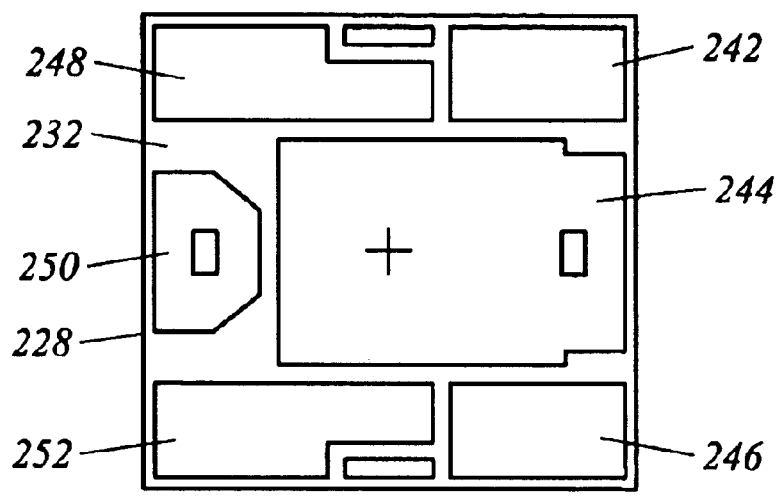
FIG. 7 illustrates a top plan view of a direct bonded metal substrate according to one embodiment of the present invention.
Figure 8:
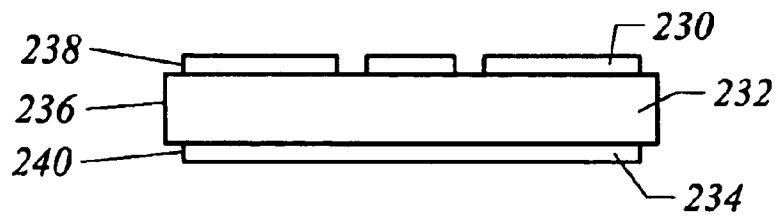
FIG. 8 illustrates a cross sectional view of a direct bonded metal substrate according to one embodiment of the present invention.

FIG. 6A depicts a top plan view of the device 200 with the plastic package 202 delayered as indicated by the dotted line. FIG. 6B depicts a cross sectional view of the device 200 with the plastic package 202 delayered as indicated by the dotted line. As shown, in FIG. 6B, the backside of the package 202 is flushed to the backside of the DBC substrate according to one embodiment of the present invention. FIG. 7 depicts a top plan view of a direct bonded metal substrate 228 of the device 200, and FIG. 8 depicts a cross sectional view of the direct bonded metal substrate 228, according to one embodiment of the present invention. The direct bonded metal substrate 228 has a first conductive (front side) layer 230 that is bonded to a second dielectric layer 232, typically of ceramic material, that is in turn bonded to a third conductive (backside) layer 234 (FIG. 8). The dielectric layer 232 generally has an outer edge 236, which extends beyond outer edges 238 and 240 of the first and third conductive layers, to provide better electrical isolation of the two conductive layers. The direct bonded metal substrate may be a DBC or DAB substrate. The direct bonded metal substrates provide superior thermal conductivity due to its "eutectic bond" between the conductive layers and the dielectric layer. Accordingly, in many instances, non-beryllia substrates (e.g., AlN and $Al_2O_3$) may be used for high frequency RF power devices without significantly comprising the requisite thermal conductivity.

In the present exemplary embodiment, the substrate is a DBC substrate with alumina as the dielectric layer 232. The dielectric layer could be other material, such as aluminum nitride, beryllia (BeO), or other insulating material compatible with direct bonded metal substrate fabrication. One or both of the copper layers may be tinned or plated. Each layer of the copper layer is about 0.0118 inch (0.30 mm) thick, and the alumina layer is about 0.0248 inch (0.630 mm) thick, making the DBC substrate about 0.0484 inch (1.230 mm) thick overall. However, these thickness are given as examples only and thicker or thinner layers could be used. In one embodiment, due to the toxic nature of beryllia, aluminum nitride and alumina are the materials of choice for the dielectric layer.

The first conductive layer 230, e.g., a copper layer, is patterned to have a plurality of conductive islands or blocks 242–252 that are separated by the ceramic layer 232 provided below (FIG. 7). Referring to FIG. 6, a bonding portion 254 of the lead 204 is bonded to the block 242; a bonding portion 256 of the lead 206 is bonded to the block 244; a bonding portion 258 is bonded to the block 246; a bonding portion 260 of the lead 210 is bonded to the block 248; a bonding portion 262 of the lead 212 is bonded to the block 250; and a bonding portion 264 of the lead 214 is bonded to the block 252. These bonding portions of the leads are soldered to the respective blocks of the first conductive layer 230. A semiconductor die 266 with one or more transistors defined thereon is bonded to the block 244. Various conductive regions, such as, gate, source, and drain regions, are electrically coupled to the leads via wires 268 extending from the die to the leads. In one embodiment, the wires 268 are aluminum wires but other conductive wires may be used. Bonding the leads to the blocks of the first conductive layer 230, as shown in FIG. 6, facilitates manufacturing of a plurality of the devices 200 in a single assembly process, as will be described in more detail later. In addition, the solder bonding the leads to the blocks provides more stable joining of the leads to the package 202, than merely bonding the leads to the edges of the ceramic cap as in the conventional device 100 in FIG. 1.

The power device 200 with a DBC substrate 228 tends to provide greater structural integrity. The substrate or pad, on which the semiconductor die, is provided is less likely to crack because the composite DBC structure provides support for the ceramic layer. Cracking of the semiconductor die is also reduced because the thermal expansion coefficient of copper more closely matches that of silicon than does the thermal expansion coefficient of typical ceramics.

Furthermore, using a bare ceramic substrate for power devices generally increases costs. To manufacture the conventional power device 100, a die attach pad is usually provided to attach the die to a ceramic substrate. This is often done by silk-screening a metal-glass frit onto the ceramic substrate and firing the frit. The metal in the frit is usually an expensive noble metal, and the screening and firing process results in additional yield loss.

The backside copper layer 234 also improves the thermal performance of the power device 200. The temperature in the vicinity of the die ("underneath" the die) tends to be higher than the temperature at the edge of the ceramic layer 232. Although the extent of this heat gradient depends on many factors, the backside copper layer 234 effectively spreads the heat across the entire ceramic layer, thereby reducing the formation of a hot-spot underneath the die. More effective heat distribution also reduces heat-related stress and resultant cracking of the substrate and/or die, thus improving reliability.

Figure 9:
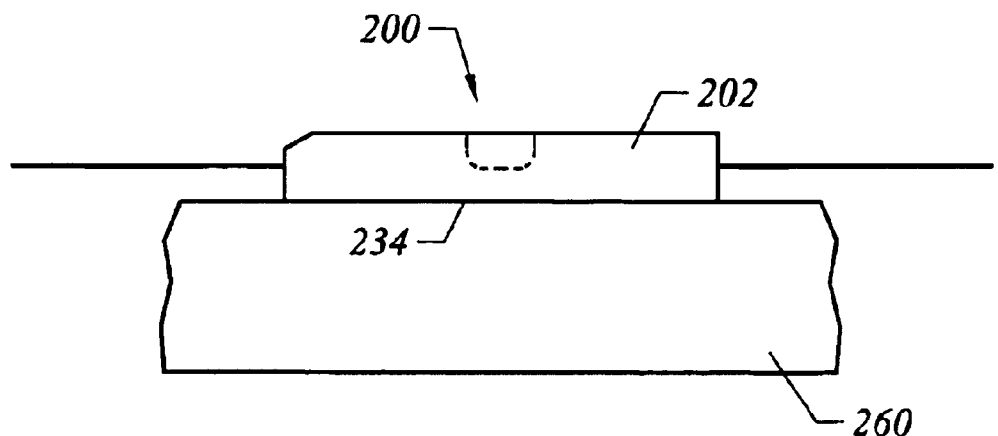
FIG. 9 illustrates a cross sectional view of a high frequency RF device coupled to a heatsink according to one embodiment of the present invention.

Additionally, the direct-bonding process, described below, intimately attaches the copper to the ceramic (i.e., creates a "eutectic bond" between the copper and ceramic) and provides excellent thermal conduction from one layer to the other. This thermal conduction provided by the copper layer 234 is better than that typically provided by contacting a bare ceramic substrate to a heatsink. The relatively high thermal resistance of the ceramic impedes lateral heat spreading, so that each microscopic contact point with the heatsink becomes a hot-spot. In contrast, the heat-conductivity of the backside copper layer 234 provides good lateral heat conduction and reduces the consequences of localized contact with the heatsink. Moreover, the backside copper layer allows the RF power device 200 to be soldered to a heatsink, thermally coupling the entire area of the backside layer to a heatsink 260, as shown in FIG. 9.

Even if the back side of a ceramic substrate were coated with frit and fired, the thermal performance would not equal that of the DBC packaged device, such as the power device 200, as the metal-glass matrix of the fired frit does not conduct heat as well at the copper layer of the DBC packaged device.

Figure 10:
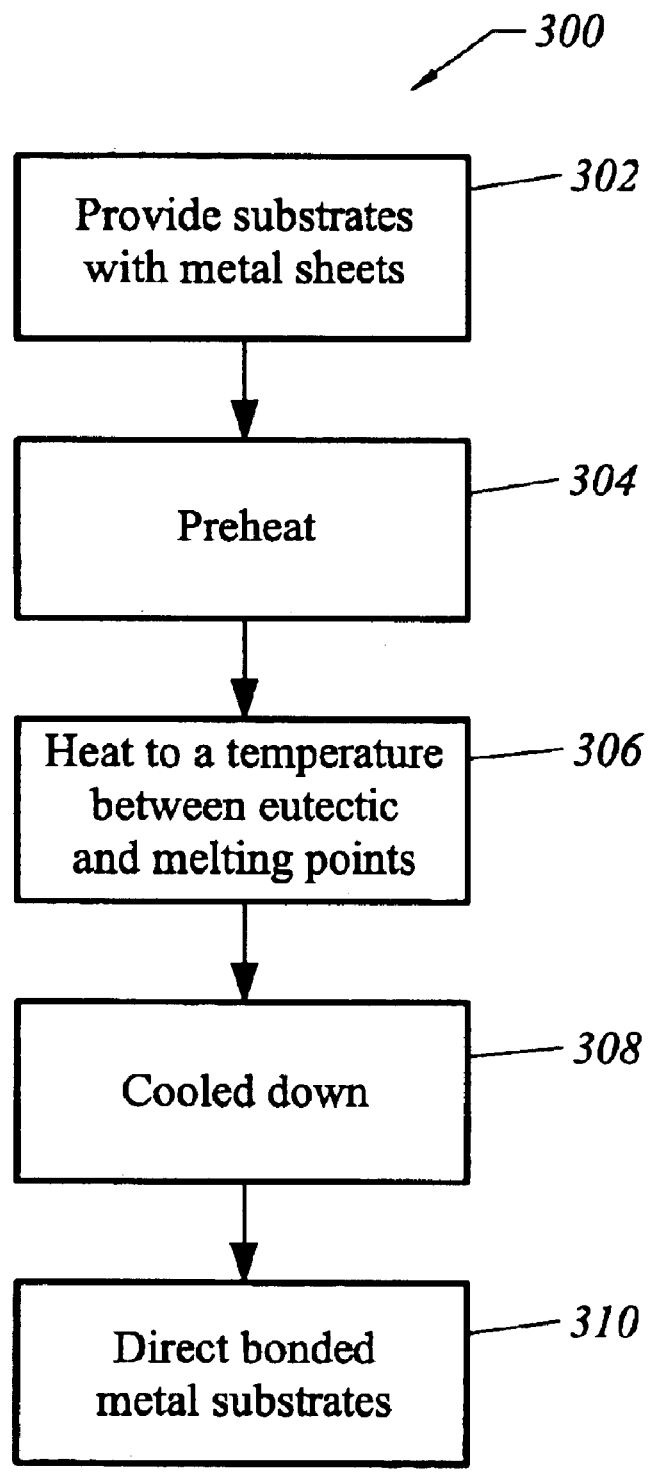
FIG. 10 illustrates a process of manufacturing a direct bonded substrate according to one embodiment of the present invention.

FIG. 10 depicts a method 300 for forming the direct bonded metal substrate 228, e.g., a DBC substrate, according to one embodiment of the present invention. A detailed description of manufacturing the direct bonded metal substrate according to one embodiment is provided in U.S. Pat. No. 4,483,810, which is incorporated by reference for all purposes.

Generally, the method involves placing a conductive or metal substrate on a dielectric or ceramic substrate and heating them to a temperature between the eutectic temperature and the melting temperature of the conductive substrate. For example, a metal substrate, e.g., copper, is placed on a ceramic substrate (step 302). A thin oxide layer may be formed over the copper substrate on the side facing the ceramic substrate or on the both sides. The copper and ceramic substrates are placed in a carrier, preferably of silicon carbide or graphite core with a silicon carbide coating, and inserted into a furnace. The copper and ceramic substrates are preheated (step 304). The preheat step is typically performed in a first zone within the furnace to gradually ramp up the temperature of the substrates. The first zone may include a plurality of sub-zones in one embodiment. The temperature within the first zone is kept at no more than about 960° C. in one embodiment of the present invention.

The copper and ceramic substrates are heated to a temperature between eutectic and melting temperatures of copper (step 306). Generally, the substrates are moved into a second zone within the furnace during this step. In one embodiment, the peak temperature within the second zone is less than 1083° C., preferably about 1071° C., to raise the temperatures of the substrates to above the eutectic temperature of copper, which is about 1065° C. As a result a eutectic melt is formed between the copper substrate and the ceramic substrate.

The substrates are cooled to a predetermined temperature to solidify the eutectic melt (step 308). Generally, the substrates are moved to a third zone within the furnace. The solidification of the eutectic melt does not occur instantaneously, and the bonding process is not completed until the temperature drops well below the eutectic temperature, usually about 100° C. below the eutectic temperature. The cooling process generally involves two or more steps to gradually ramp down the temperature during a period of about 20 minutes. The resulting product is a direct bonded copper substrate, such as the DBC substrate 228 (step 310).

Figure 11:
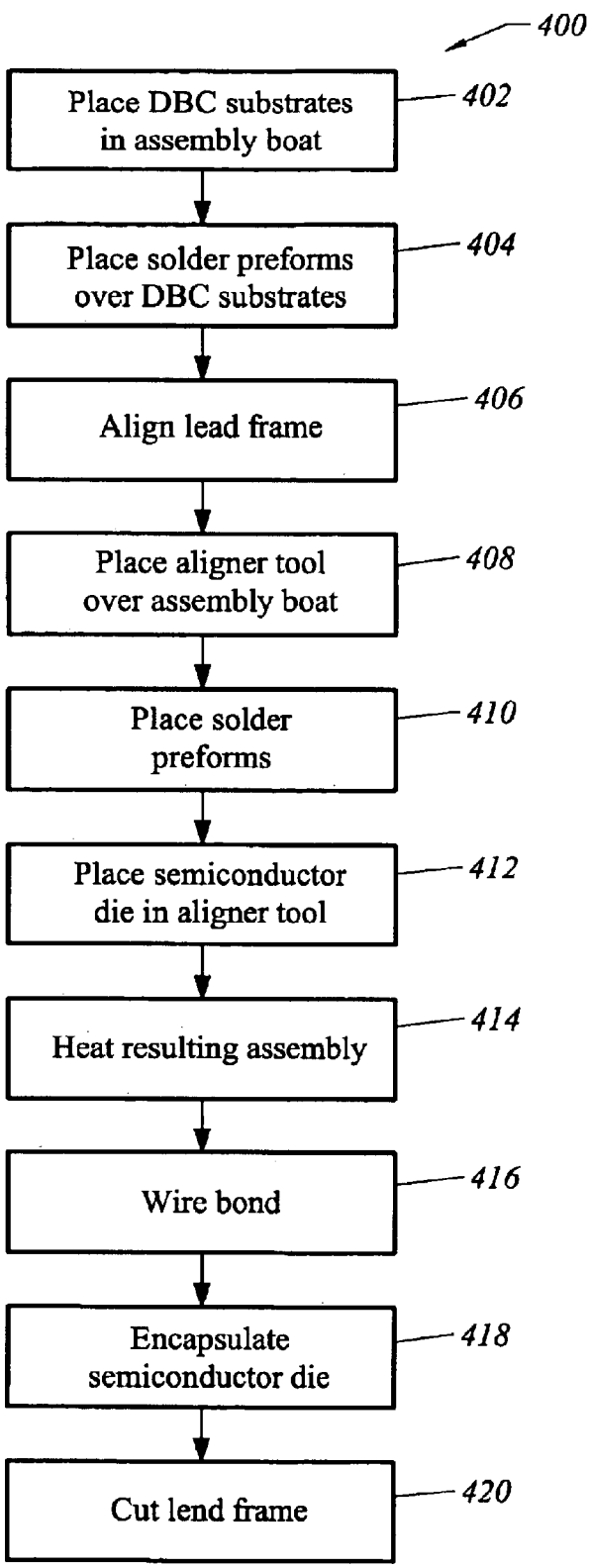
FIG. 11 illustrates a process of manufacturing a high frequency RF device according to one embodiment of the present invention.

FIG. 11 shows an assembly process 400 for attaching leads and dice to direct bonded metal substrates, e.g., DBC substrates, in a single soldering operation according to one embodiment of the present invention. The process 400 does not use a ceramic cap nor a ceramic base or pad with preattached leads to package the power devices. Rather, the power devices, e.g., the device 200, according to the present embodiment uses a DBC substrate as the only ceramic part of the device. The semiconductor die and DBC substrate are encapsulated in plastic by an injection molding process. Use of non-beryllia substrates, a single soldering operation (or assembly process), and a plastic molding process according to the process 400 significantly reduces the manufacturing cost of the high RF power devices. For example, a high frequency power device, such as the device 200, that is manufactured using the process 400 may be sold at about $10–20. In contrast, the conventional RF device 100 (FIG. 1) is being sold at about $100.

Figure 12:
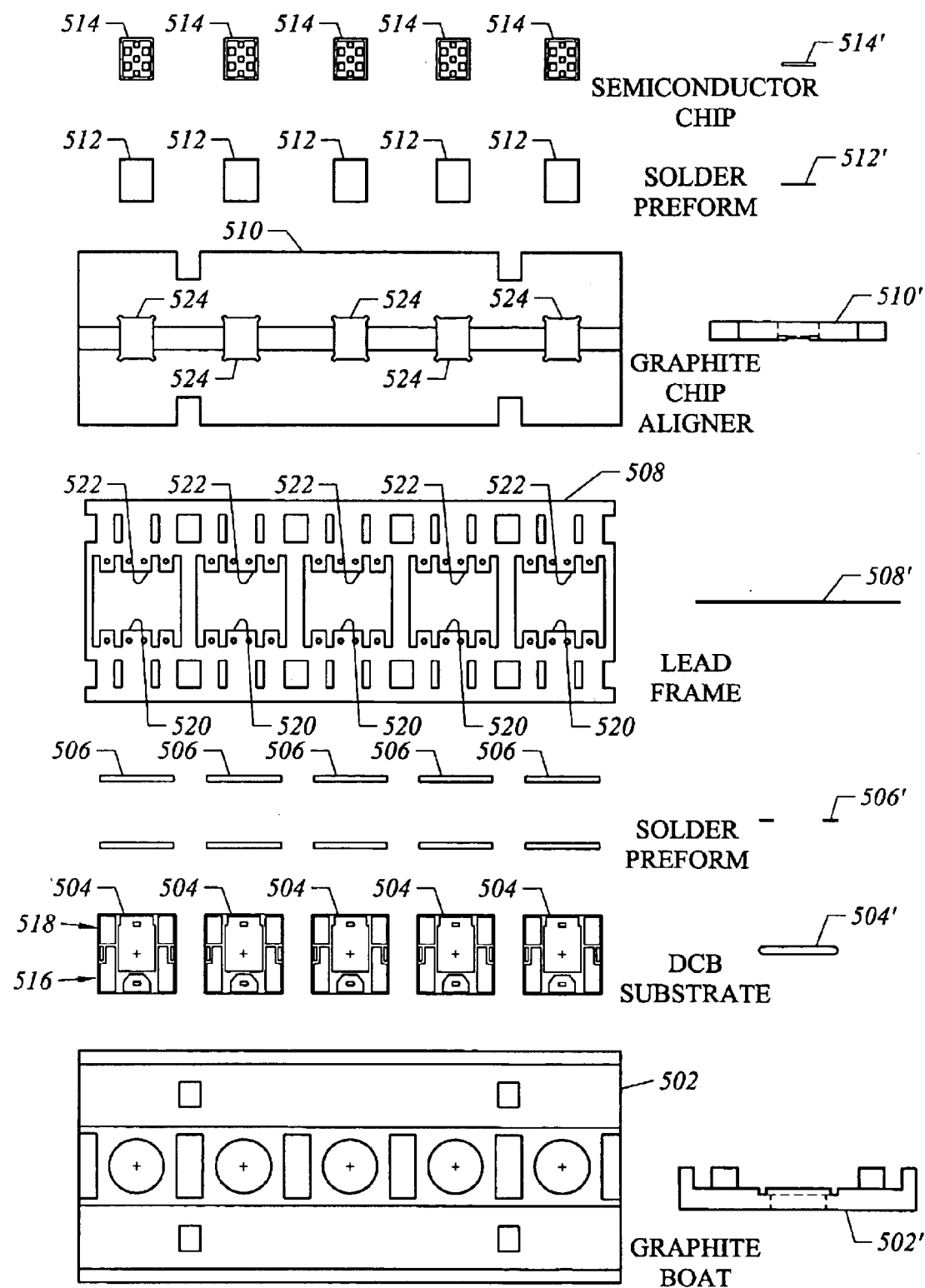
FIG. 12 illustrates an exploded view of the components and devices used to manufacture the high frequency RF device according to one embodiment of the present invention.

FIG. 12 provides an exploded view of the components and devices used for the process 400 according to one embodiment of the present invention. A graphite assembly boat 502, 502', a plurality of DCB or DBC substrates 504, 504', a plurality of solder preforms 506, 506', a lead frame 508, 508', a graphite chip aligner 510, 510', a plurality of solder preforms 512, 512', and a plurality of semiconductor chips or dice 514, 514' are used to manufacturing a plurality of high frequency RF power devices, such as devices 200, according to the process 400. The numerals without the primes depict top plan views of the components and devices, whereas the numerals with the primes depict side views of the components and devices used in the process 400.

Referring back to FIG. 11, the DBC substrates 504 are placed in machined pockets in the graphite assembly boat 502 (step 402). In other embodiment, the assembly boat may be of material other than graphite. The solder preforms 506 are placed over the DBC substrates on opposite sides 516 and 518 of the substrates (step 404). The lead frame 508 is placed in a separate machined pocket of the assembly boat to align the bonding portions 520 and 522 of the lead frame to corresponding portions of the patterned die-side copper layer of the DBC substrate (step 406). That is, the sides 516 and 518 of the DBC substrates are aligned to the bonding portions 520 and 522. The chip aligner tool 510 is placed over the assembly boat, further holding the leads in proper alignment to the DBC substrate (step 408). The solder preforms 512 are placed within a plurality of openings 524 (step 410). The power semiconductor dice 514 are placed over the solder preforms 512 and in the opening 524 of the chip aligner tool, thereby aligning the chips to the DBC substrate (step 412). The resulting assembly is then heated to melt the solder preforms 506 and 512, thereby concurrently soldering the lead frame and power semiconductor dice to the DBC substrates (step 414). The solder process is typically carried out in a single pass in a reflow belt furnace in a reducing atmosphere, thus eliminating the need for a solder flux, as is known in the art, but other furnaces or heat sources could be used. The chips are wirebonded to the leads to provide proper electrical connections (step 416). The resulting product, a plurality of devices held together by the lead frame, is placed in an injection molding tool to encapsulate each device with a plastic package (step 418). The product is cut and trimmed to form individual devices as shown in FIGS. 3–5 (step 420).

In other embodiments, the chip could be attached to the DBC substrate in one operation and the leads attached in another, such as using a high-temperature solder or braze, or eutectic die attach, for the chip attach, and another solder, spot-weld, or similar operation for the lead attach. DBC substrates could be attached to lead frames, and these subassemblies could be shipped to an assembly facility, where the semiconductor dice would be attached and the wire-bonding and encapsulation performed. Normally, the first attachment process, whether it be used to attach the leads or the dice, results in an attachment that is reliable at the temperature of the second attachment process.

While the invention has been particularly shown and described with reference to a specific embodiment thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A radio frequency (RF) power device, comprising:
   a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other;

a semiconductor die being bonded to the first conductive layer of the substrate;

a plastic package to enclose and protect the semiconductor die; and a plurality of leads extending outwardly from the plastic package, the leads having blade-like shapes.

2. The power device of claim 1, wherein the substrate is a direct bonded metal substrate and the third conductive layer of the substrate is coupled to a heatsink to dissipate heat generated by the power device, the heatsink being separate from the power device.

3. The power device of claim 1, wherein the first conductive layer is patterned to provide a plurality of conductive blocks that are electrically coupled to the die and the plurality of leads.

4. The power device of claim 3, wherein the plurality of leads are electrically coupled to the plurality of conductive blocks of the first conductive layer, wherein a first lead is directly bonded to a first conductive block of the first conductive layers that is electrically isolated from a second conductive block of the first conductive layer that is bonded to the semiconductor die, where the first conductive block of the first conductive layer is wire bonded with the semiconductor die to electrically coupled the first lead with the semiconductor die.

5. The power device of claim 1, wherein the substrate is a direct copper bonded substrate, wherein the first and third conductive layers are copper layers.

6. The power device of claim 5, wherein the second dielectric layer is AlN or Al2O3.

7. The power device of claim 1, wherein the plastic package encloses at least the semiconductor die and the first conductive layer.

8. The power device of claim 7, wherein the plastic package encloses sides of the second dielectric layer and third conductive layer.

9. The power device of claim 7, wherein the third conductive layer has a front side and a backside, the front side being bonded to the second dielectric layer, where a bottom surface of the plastic package is flushed to the backside of the third conductive layer to substantially expose the backside of the third conductive layer.

10. The power device of claim 1, wherein the leads are configured to have blade-like shape to handle the skin effect of high frequency operations of the power device.

11. The power device of claim 1, wherein outer edges of the second dielectric layer extends beyond outer edges of the first and third conductive layers to ensure electrical isolation between the first and third conductive layers.

12. A radio frequency (RF) power device, comprising:

a direct copper bonded (DCB) substrate including first and second copper layers separated by a dielectric layer, so that the first and second copper layers are electrically isolated;

a semiconductor die provided on the first copper layer of the DCB substrate;

a plastic encapsulant to enclose the die and portions of the DCB substrate, where a backside of the second copper layer is exposed to form a backside of the power device;

a first lead having a blade-like shape extending outwardly from a first side of the plastic encapsulant; and a second lead having a blade-like shape extending outwardly from a second side of the plastic encapsulant, the second side of the plastic encapsulant being provided at an opposing side of the first side of the plastic encapsulant.

13. The power device of claim 12, wherein the device is configured to operate at a frequency above 80 Mhz.

14. The power device of claim 12, wherein a bottom surface of the plastic encapsulant is substantially flushed to the backside of the second copper layer.

15. The power device of claim 12, wherein the dielectric layer is aluminum nitride.

16. The power device of claim 12, wherein the dielectric layer is alumina.

17. The power device of claim 12, wherein the power device is a discrete power device with a single semiconductor die.

18. The power device of claim 12, wherein the plastic encapsulant has a bottom surface area of 0.2–0.6 square inch.

19. The power device of claim 12, wherein the plastic encapsulant is a plastic RF power device package having a bottom surface area of less than about 1 square inch.

20. A radio frequency (RE) power device, comprising:

a direct bonded substrate including first and second conductive layers separated by a dielectric layer, so that the first and second conductive layers are electrically isolated, the first conductive layer being patterned into a plurality of blocks;

a plurality of leads being bonded to the plurality of blocks of the first conductive layer;

a semiconductor die being bonded to one of the plurality of blocks of the first conductive layer, the semiconductor die being electrically coupled to the plurality of leads via a plurality of wires extending the semiconductor die to the plurality of the blocks of the first conductive layer;

a plastic package to enclose the die and portions of the substrate, where a backside of the second conductive layer is exposed to be joined to a heatsink to dissipate heat generated by the power device;

a first lead having a blade-like shape extending outwardly from a first side of the plastic package; and a second lead having a blade-like shape extending outwardly from a second side of the plastic package, the second side of the plastic package being provided at an opposing side of the first side of the plastic package.

21. A method for fabricating a high frequency power device, comprising:

providing a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other;

bonding a semiconductor die to the first conductive layer of the substrate; and enclosing the semiconductor die within a plastic package.

22. A method for fabricating a plurality of radio frequency (RF) power devices in a single process, the method comprising:

providing an assembly boat;

placing a plurality of substrates into the assembly boat;

providing a lead frame over the plurality of direct bonded substrates;

providing a plurality of semiconductor dice over the direct bonded substrates; and forming plastic encapsulation over the plurality of the substrates, the lead frame, and the plurality of semiconductor dice, wherein portions of the lead frame are extending outwardly from the plastic encapsulation.

23. The power device of claim 1, wherein the substrate is a direct aluminum bonded substrate, wherein the first and third conductive layers are aluminum layers.

24. A radio frequency (RF) power device, comprising:

a direct aluminum bonded (DAB) substrate including first and second aluminum layers separated by a dielectric layer, so that the first and second aluminum layers are electrically isolated;

a semiconductor die provided on the first aluminum layer of the DAB substrate;

a plastic encapsulant to enclose the die and portions of the DAB substrate, where a backside of the second aluminum layer is exposed to form a backside of the power device;

a first lead having a blade-like shape extending outwardly from a first side of the plastic encapsulant; and a second lead having a blade-like shape extending outwardly from a second side of the plastic encapsulant, the second side of the plastic encapsulant being provided at an opposing side of the first side of the plastic encapsulant.

* * * * *